US011290109B1

(12) United States Patent
Vang et al.

(10) Patent No.: US 11,290,109 B1
(45) Date of Patent: Mar. 29, 2022

(54) MULTIBIT MULTI-HEIGHT CELL TO IMPROVE PIN ACCESSIBILITY

(71) Applicant: QUALCOMM Incorporated, San Diego, CA (US)

(72) Inventors: Foua Vang, Sacramento, CA (US); Hyeokjin Lim, San Diego, CA (US); Seung Hyuk Kang, San Diego, CA (US); Venugopal Boynapalli, San Diego, CA (US); Shitiz Arora, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 40 days.

(21) Appl. No.: 17/030,087

(22) Filed: Sep. 23, 2020

(51) Int. Cl.
*H01L 21/00* (2006.01)
*H03K 19/094* (2006.01)
*H01L 23/528* (2006.01)

(52) U.S. Cl.
CPC ..... *H03K 19/09425* (2013.01); *H01L 23/528* (2013.01)

(58) Field of Classification Search
CPC .......................... H03K 19/09425; H01L 23/528
See application file for complete search history.

(56) References Cited

U.S. PATENT DOCUMENTS 8,742,464 B2 * 6/2014 Sherlekar .............. G06F 30/394
257/207
9,070,552 B1 * 6/2015 Shah ................. H01L 27/11807
(Continued)

FOREIGN PATENT DOCUMENTS

CN 105190403 A * 12/2015 ........... G09G 3/2003
CN 105612436 A * 5/2016 ............... G02B 1/11
(Continued)

OTHER PUBLICATIONS

Fan X., et al., "Synthesizable Memory Arrays Based on Logic Gates for Subthreshold Operation in IoT", IEEE Transactions on Circuits and Systems 1: Regular Papers, IEEE, US, vol. 66, No. 3, Mar. 1, 2019 (Mar. 1, 2019), pp. 941-954, XP011708915, ISSN: 1549-8328, DOI: 10. 1109/TCSI. 2018.2873026. [Retrieved on Feb. 4, 20194] The Whole Document.

(Continued)

*Primary Examiner* — Laura M Menz
(74) *Attorney, Agent, or Firm* — Procopio, Cory, Hargreaves & Savitch LLP

(57) ABSTRACT

A MOS IC includes a MOS logic cell that includes first and second sets of transistor logic in first and second subcells, respectively. The first and second sets of transistor logic are functionally isolated from each other. The MOS logic cell includes a first set of $M_x$ layer interconnects on an $M_x$ layer extending in a first direction over the first and second subcells. A first subset of the first set of $M_x$ layer interconnects is coupled to inputs/outputs of the first set of transistor logic in the first subcell and is unconnected to the second set of transistor logic. Each of the first subset of the first set of $M_x$ layer interconnects extends from the corresponding input/output of the first set of transistor logic of the first subcell to the second subcell, and is the corresponding input/output of the first set of transistor logic.

18 Claims, 7 Drawing Sheets

(56) References Cited

U.S. PATENT DOCUMENTS

| | | | |
|---|---|---|---|
| 9,136,267 B2 * | 9/2015 | Sun | H01L 27/0207 |
| 9,483,600 B2 * | 11/2016 | Bansal | H01L 27/0207 |
| 9,502,351 B1 * | 11/2016 | Sahu | H01L 27/0207 |
| 9,514,264 B1 * | 12/2016 | Nebesnyi | G06F 30/392 |
| 9,645,604 B1 * | 5/2017 | Nebesnyi | G06F 1/12 |
| 9,887,209 B2 * | 2/2018 | Gupta | H01L 27/0207 |
| 10,090,244 B2 * | 10/2018 | Xu | H01L 23/5283 |
| 10,128,189 B2 * | 11/2018 | Zohrabyan | H01L 23/535 |
| 10,541,243 B2 * | 1/2020 | Do | H01L 23/5226 |
| 10,726,186 B2 * | 7/2020 | Kim | G06F 30/394 |
| 10,740,531 B2 * | 8/2020 | Yang | H01L 23/5286 |
| 10,811,357 B2 * | 10/2020 | Lee | H01L 27/0207 |
| 2015/0333008 A1 * | 11/2015 | Gupta | H01L 27/0207 257/369 |
| 2018/0183414 A1 | 6/2018 | Guo et al. | |
| 2018/0314785 A1 * | 11/2018 | Schultz | G06F 30/394 |
| 2020/0058586 A1 | 2/2020 | Guo et al. | |
| 2020/0099342 A1 * | 3/2020 | Hau | H03F 1/0277 |
| 2020/0134124 A1 | 4/2020 | Sue et al. | |
| 2021/0280571 A1 * | 9/2021 | Lim | H01L 27/0207 |

FOREIGN PATENT DOCUMENTS

| | | | | |
|---|---|---|---|---|
| CN | 109417747 A | * | 3/2019 | H04W 24/10 |
| WO | WO-2018013472 A1 | * | 1/2018 | H01L 27/0207 |

OTHER PUBLICATIONS

International Search Report and Written Opinion—PCT/US2021/044463—ISA/EPO—dated Dec. 1, 2021.

Xu X., et al., "Concurrent Pin Access Optimization for Unidirectional Routing", Jun. 18, 2017, 1077952576-1077952576, Jun. 18, 2017 (Jun. 18, 2017), pp. 1-6, XP058367776, DOI: 10.1145/3061639.3062214 ISBN: 978-1-4503-4927-7 Section "Introduction"; figure 1.

* cited by examiner

US 11,290,109 B1

MULTIBIT MULTI-HEIGHT CELL TO IMPROVE PIN ACCESSIBILITY

BACKGROUND

Field

The present disclosure relates generally to a standard/logic cell architecture, and more particularly, to a multibit multi-height cell to improve pin accessibility.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

Routing for cells can be congested when cell pins are located close together, such as in high pin density cells. To reduce the congestion, some cells may need to be placed further from each other. As a consequence, cell placement may be less dense and may require a greater area/footprint of the IC. Accordingly, there is a need for a cell architecture that improves pin accessibility without necessitating usage of a greater area/footprint of the IC.

SUMMARY

In an aspect of the disclosure, a metal oxide semiconductor (MOS) IC includes a MOS logic cell. The MOS logic cell includes a first set of transistor logic in a first subcell of the logic cell and a second set of transistor logic in a second subcell of the logic cell. The first set of transistor logic and the second set of transistor logic are functionally isolated from each other within the MOS logic cell. The MOS logic cell further includes a first set of $M_x$ layer interconnects on an $M_x$ layer extending in a first direction over the first subcell and the second subcell. A first subset of the first set of $M_x$ layer interconnects is coupled to an input or an output of the first set of transistor logic in the first subcell and is unconnected to the second set of transistor logic. Each of the first subset of the first set of $M_x$ layer interconnects extends from the input or the output of the first set of transistor logic of the first subcell to the second subcell. Each of the first subset of the first set of $M_x$ layer interconnects is an input/output of the first set of transistor logic.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
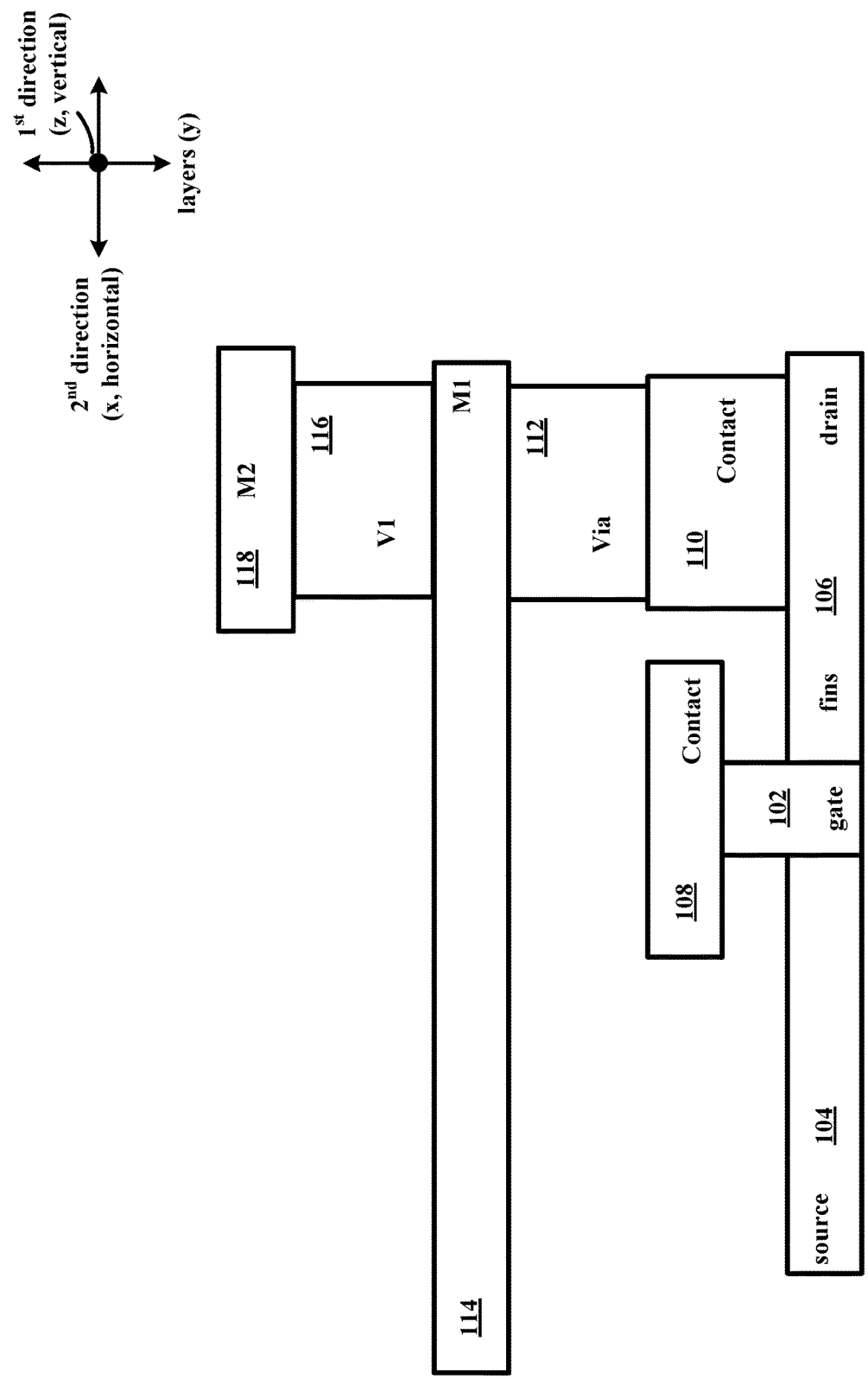
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY even though the gate may be formed of metal, polysilicon, or a combination of polysilicon and metal), a source 104, and a drain 106. The source 104 and the drain 106 may be formed by fins. The gate 102 may extend in a first direction (e.g., vertical direction along the z axis coming out of the page), and the fins may extend in a second direction orthogonal to the first direction (e.g., horizontal direction along the x axis). A contact layer interconnect 108 (also referred to as a metal POLY (MP) layer interconnect) may contact the gate 102. A contact layer interconnect 110 (also referred to as a metal diffusion (MD) layer interconnect) may contact the source 104 and/or the drain 106. A via 112 may contact the layer interconnect 110. A metal 1 (M1) layer interconnect 114 may contact the via 112. The M1 layer interconnect 114 may extend in the first direction only or the second direction only (i.e., unidirectional in the first direction or the second direction). The M1 layer interconnect 114 is illustrated extending unidirectionally in the second direction. A via V1 116 may contact the M1 layer interconnect 114. A metal 2 (M2) layer interconnect 118 may contact the via V1 116. The M2 layer interconnect 118 may extend in the first direction only (i.e., unidirectional in the first direction). Specifically, the M2 layer may be unidirectional in the vertical direction. Higher layers include a via layer including vias V2 and a metal 3 (M3) layer including M3 layer interconnects. The M3 layer interconnects may extend in the second direction.

Figure 2:
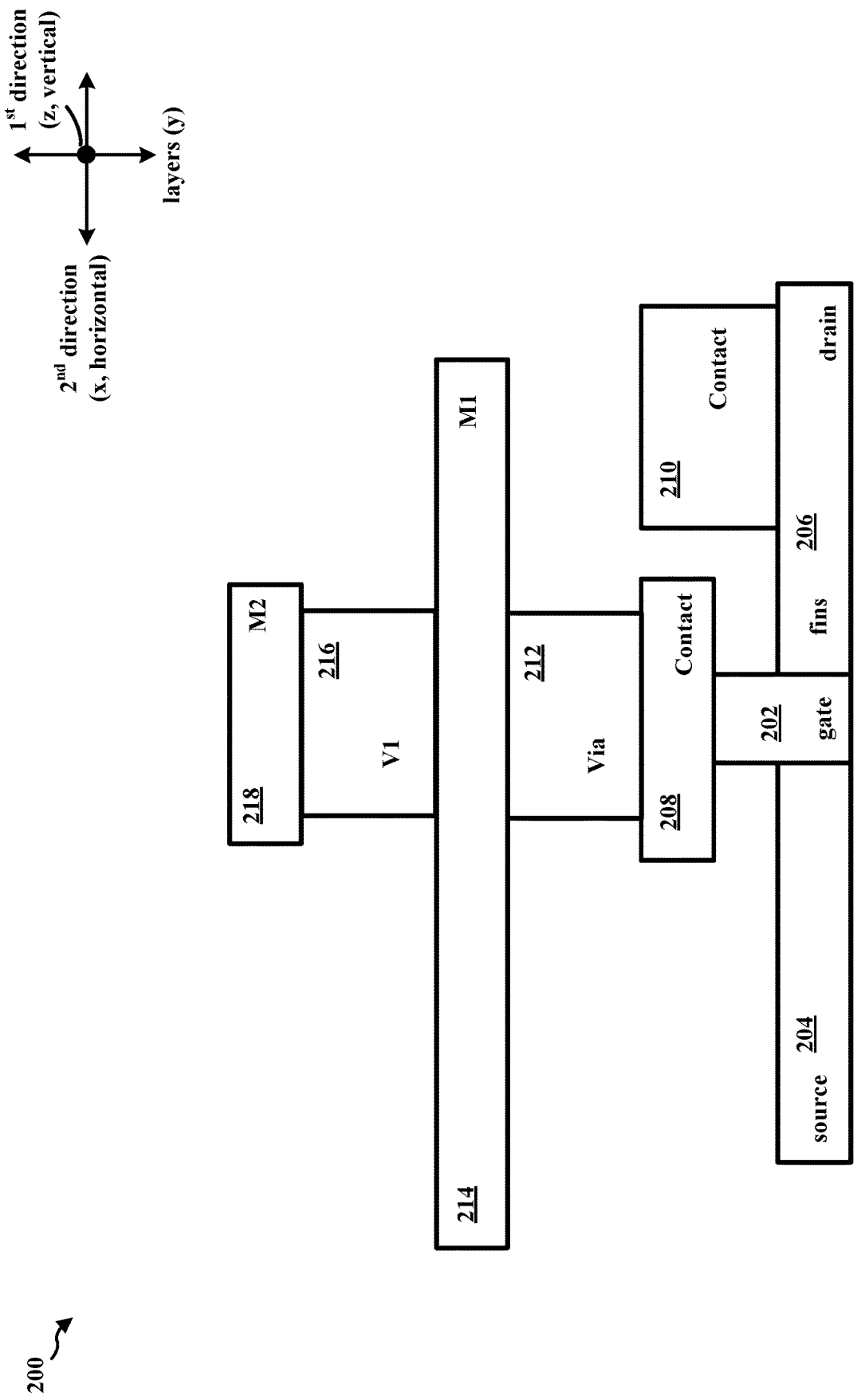
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a first direction (e.g., vertical direction along the z axis coming out of the page), and the fins may extend in a second direction orthogonal to the first direction (e.g., horizontal direction along the x axis). A layer interconnect 208 may contact the gate 202. A layer interconnect 210 may contact the source 204 and/or the drain 206. A via 212 may contact the layer interconnect 208. An M1 layer interconnect 214 may contact the via 212. The M1 layer interconnect 214 may extend in the first direction only or the second direction only (i.e., unidirectional in the first direction or the second direction). The M1 layer interconnect 214 is illustrated extending unidirectionally in the second direction. A via V1 216 may contact the M1 layer interconnect 214. An M2 layer interconnect 218 may contact the via V1 216. The M2 layer interconnect 218 may extend in the first direction only (i.e., unidirectional in the first direction). Specifically, the M2 layer may be unidirectional in the vertical direction. Higher layers include a via layer including vias V2 and an M3 layer including M3 layer interconnects. The M3 layer interconnects may extend in the second direction.

Standard cells are cells that are standardized in a design. The same standard cell may be utilized thousands of times throughout an IC. Herein, standard cells may be referred to as logic cells. A logic cell has a set of inputs and set of outputs, where the transistor logic between the inputs and the outputs are interconnected through inter-cell routing within the logic cell (rather than intra-cell routing across different logic cells). Such logic cell may be utilized in an IC hundreds to thousands of times, with the same inter-cell routing configuration.

As discussed supra, routing for cells can be congested when cell pins are located close together, such as in high pin density cells. To reduce the congestion, some cells may be placed further from each other. As a consequence, cell placement may be less dense and may require a greater area/footprint of the IC. A cell architecture that improves pin accessibility without necessitating usage of a greater area/footprint of the IC is provided infra.

Figure 3:
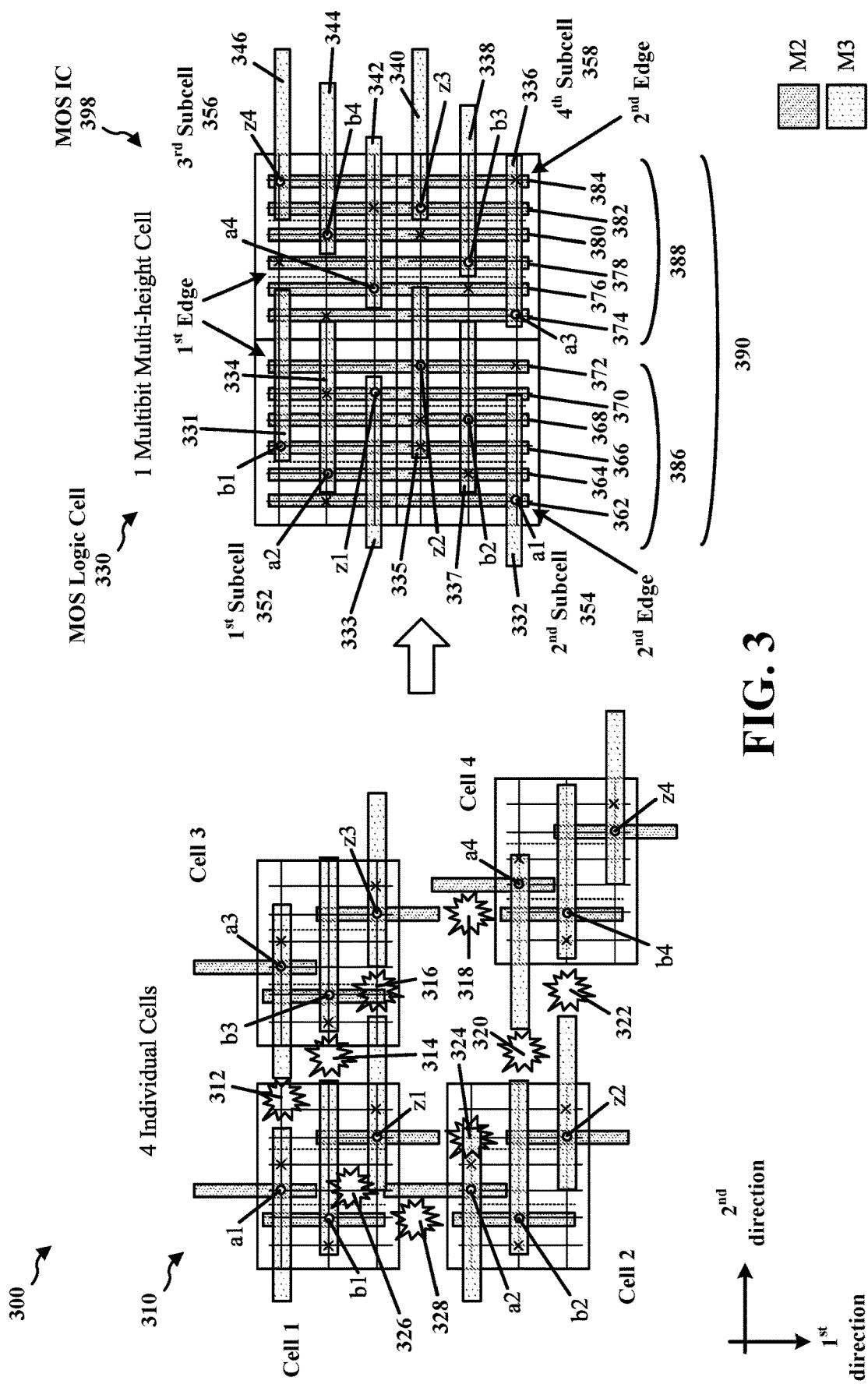
FIG. 3 is a first diagram conceptually illustrating pin routing congestion and a multibit multi-height cell for improving pin routing accessibility.

FIG. 3 is a first diagram 300 conceptually illustrating pin routing congestion and a multibit multi-height cell for improving pin routing accessibility. The four individual cells 310 includes cell 1, cell 2, cell 3, and cell 4. Cell 1 has inputs a1, b1 and output z1. Cell 2 has inputs a2, b2 and output z2. Cell 3 has inputs a3, b3 and output z3. Cell 4 has inputs a4, b4 and output z4. The input/output pins are illustrated with small circles. After the cells 1-4 are placed, the pins of cells 1-4 are routed to other pins of other cells (cells other than the cells 1-4) through intra-cell routing. To illustrate possible intra-cell routing collisions 312-328 during an intra-cell routing phase, both an intra-cell M2 layer interconnect (extending in the first direction) and an intra-cell M3 layer interconnect (extending in the second direction) for each pin may be illustrated even though just one of the intra-cell M2 layer interconnect or the intra-cell M3 layer interconnect may actually be used. As illustrated in FIG. 3, the M3 layer interconnects for the intra-cell routing for input a1 and input a3 may have a routing collision 312, the M3 layer interconnects for the intra-cell routing for input b1 and input b3 may have a routing collision 314, the M3 layer interconnects for the intra-cell routing for output z1 and output z3 may have a routing collision 316, the M2 layer interconnects for the intra-cell routing for output z3 and input b4 may have a routing collision 318, the M3 layer interconnects for the intra-cell routing for input b2 and input a4 may have a routing collision 320, the M3 layer interconnects for the intra-cell routing for output z2 and input b4 may have a routing collision 322, the M2 layer interconnects for the intra-cell routing for output z1 and output z2 may have a routing collision 324, the M2 layer interconnects for the intra-cell routing for input a1 and input a2 may have a routing collision 326, and/or the M2 layer interconnects for the intra-cell routing for input b1 and input b2 may have a routing collision 328.

In order to improve the pin accessibility for intra-cell routing, the four cells 1-4 may be combined into one multibit multi-height (multi-row) cell 330 of a MOS IC 398, where each cell 1-4 corresponds to a subcell 1-4, respectively, within the cell 330. The first subcell 352 includes a first set of transistor logic, the second subcell 354 includes a second set of transistor logic, the third subcell 356 includes a third set of transistor logic, and the fourth subcell 358 includes a fourth set of transistor logic, where the first, second, third, and fourth sets of transistor logic are all functionally isolated from each other (not interconnected) within the one multibit cell 330. The first, second, third, and fourth sets of transistor logic may be AND-OR-Invert (AOI) logic or OR-AND-Invert (OAI) logic. The subcells 352, 354, 356, 358 each include gate interconnects that extend in the first direction (see, for example, FIGS. 1, 2), where the gate interconnects form the transistor gates for the different sets of transistor logic. The one multibit cell 330 may include a set of inter-cell M2 layer interconnects 390 extending in the first direction across at least portions of the first subcell 352 and the second subcell 354 (inter-cell M2 layer interconnects 386 including inter-cell M2 layer interconnects 362, 364, 366, 368, 370, 372) and across at least portions of the third subcell 356 and the fourth subcell 358 (inter-cell M2 layer interconnects 388 including inter-cell M2 layer interconnects 374, 376, 378, 380, 382, 384) from the first edge of the cell 330 to the second edge of the cell 330. The M2 layer interconnects 390 are illustrated as extending fully across the first/second subcells 352, 354 and the third/fourth subcells 356, 358, but one or more of the M2 layer interconnects 390 may extend over just a portion of the first/second subcells 352, 354 and just a portion of the third/fourth subcells 356, 358. The M2 layer interconnects 390 may extend the input/output pins into a different subcell in the first direction. The input/output pins are illustrated with small circles. Locations of the actual inputs/outputs within each subcell are illustrated with an X.

With respect to the subcells 352, 354, for example, the M2 layer interconnect 362 extends the input a1 from the first subcell 352 into the second subcell 354, where an intra-cell M3 layer interconnect 332 (located above the cell 330 within the MOS IC 398) may be coupled at the second subcell 354 to the a1 input pin of the first subcell 352. For another example, the M2 layer interconnect 364 extends the input a2 from the second subcell 354 into the first subcell 352, where an intra-cell M3 layer interconnect 334 (located above the cell 330 within the MOS IC 398) may be coupled at the first subcell 352 to the a2 input pin of the second subcell 354. Pin connections for the remaining inputs/outputs b1, z1, b2, z2 of the subcells 352, 354 are illustrated as being connected within the same subcell through intra-cell M3 layer interconnects 331, 333, 335, 337. All of the illustrated intra-cell M3 layer interconnects 331, 332, 333, 334, 335, 337 that form the pin connections are within the MOS IC 398 and not part of the cell 330. The intra-cell M3 layer interconnects 331, 332, 333, 334, 335, 337 extend over and across at least portions of the cell 330, and may extend to connect the inputs of the cell 330 to the outputs of other cells within the MOS IC 398 and to connect the outputs of the cell 330 to the inputs of other cells within the MOS IC 398.

With respect to the subcells 356, 358, for example, the M2 layer interconnects 374, 378, 382 extend the inputs/outputs a3, b3, z3, respectively, from the third subcell 356 into the fourth subcell 358, where intra-cell M3 layer interconnects 336, 338, 340 may be coupled at the fourth subcell 358 to the input/output pins a3, b3, z3, respectively, of the third subcell 356. For another example, the M2 layer interconnects 376, 380, 384 extend the inputs/outputs a4, b4, z4, respectively, from the fourth subcell 358 into the third subcell 356, where intra-cell M3 layer interconnects 342, 344, 346 may be coupled at the third subcell 356 to the input/output pins a4, b4, z4, respectively, of the fourth subcell 358.

The multibit multi-height cell is a multi-row cell, as the multi-height cell has at least two rows. The multibit multi-height cell may include one or more columns. FIG. 3 illustrates a multibit multi-height cell with 2×2 subcells. In general, the multibit multi-height cell may have R×C subcells, where R (rows)≥2 and C (columns)≥1. Each subcell may include at least one input and one output. In one configuration, each subcell may include at least three inputs/outputs (for example, two inputs and one output). When the subcells include a greater number of inputs/outputs, such as in higher pin density subcells, there may be a greater reduction in pin routing congestion through the provided cell architecture that improves the pin routing accessibility.

As described supra, in a multibit multi-height cell, inter-cell M2 layer interconnects extend across multiple subcells, providing for improved pin routing accessibility for the intra-cell router and thereby reducing intra-cell routing congestion. The intra-cell router may therefore have more freedom in selecting pin locations for the intra-cell M3 layer interconnect connections. The greater freedom in selecting pin locations may allow the intra-cell router to select the pin locations that reduce the pin routing congestion. The inter-cell layer interconnects that extend across the multiple subcells are illustrated as M2 layer interconnects, but may generally be $M_x$ layer interconnects on an $M_x$ layer, where the $M_x$ layer is the lowest metal layer or the second lowest metal layer extending in the first direction. If the $M_{x-1}$ layer is unidirectional in the second direction, then the $M_x$ layer is the lowest metal layer extending unidirectionally in the first direction. If the $M_{x-1}$ layer is unidirectional in the first direction, then the $M_x$ layer is the second lowest metal layer extending unidirectionally in the first direction. In one configuration, the $M_x$ layer may be the M2 layer.

Figure 4:
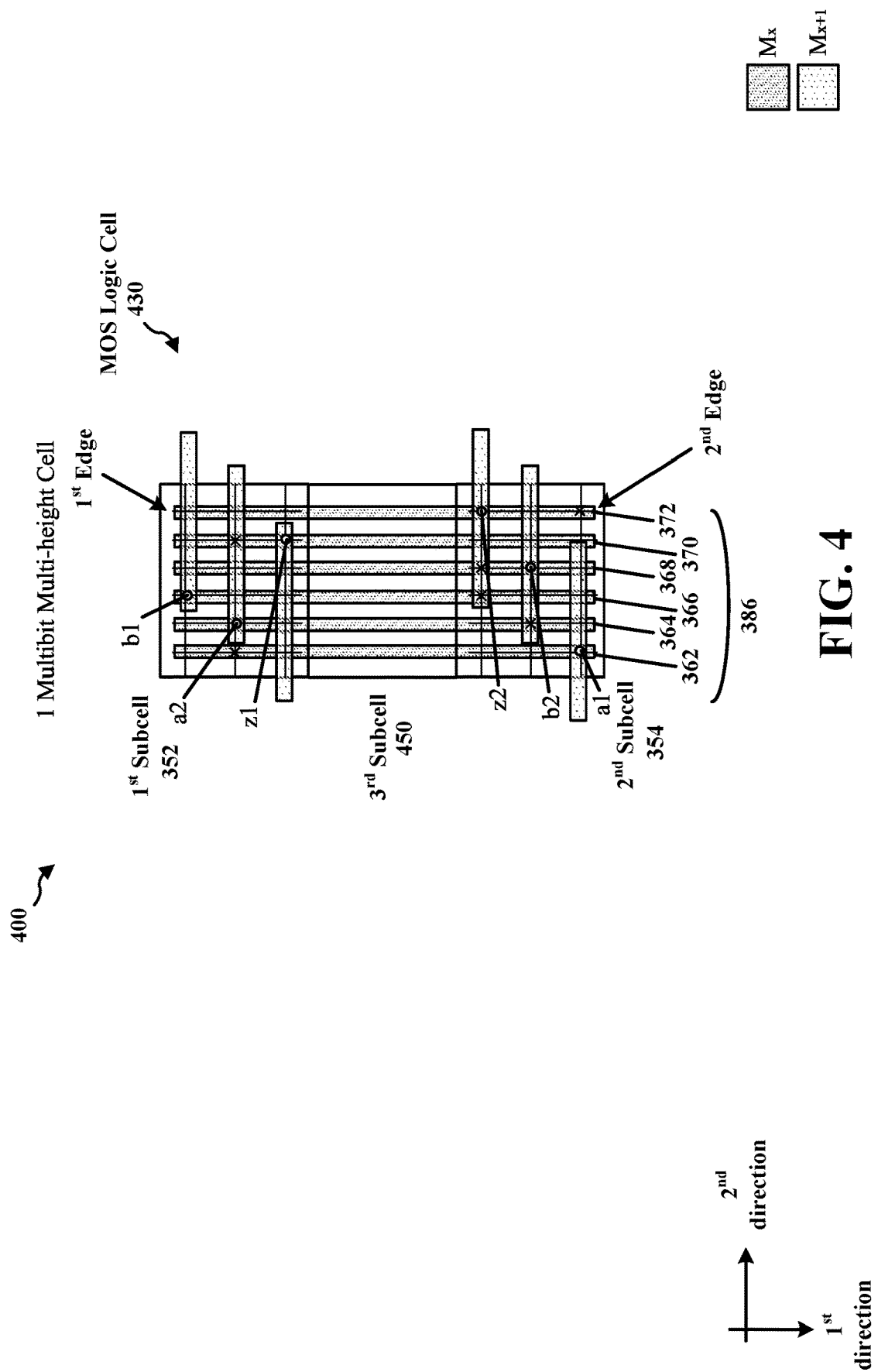
FIG. 4 is a second diagram conceptually illustrating pin routing congestion and a multibit multi-height cell for improving pin routing accessibility.

FIG. 4 is a diagram 400 conceptually illustrating pin routing congestion and a multibit multi-height cell for improving pin routing accessibility. As illustrated in FIG. 4, one or more subcells may be between the first subcell 352 and the second subcell 354. For example, a third subcell 450 may be between the first subcell 352 and the second subcell 354. As such, the MOS logic cell 430 may further include a third set of transistor logic in a third subcell 450 of the logic cell 430. The first, second, and third sets of transistor logic are functionally isolated from each other within the MOS logic cell 430. The third subcell 450 is between the first subcell 352 and the second subcell 354. The $M_x$ layer interconnects 362, 366, 368 are unconnected to the third set of transistor logic. Each of the $M_x$ layer interconnects 362, 366, 368 extends from the input or the output of the first set of transistor logic of the first subcell 352 entirely over the third subcell 450 to the second subcell 354. The $M_x$ layer interconnects 364, 368, 370 are also unconnected to the third set of transistor logic. Each of the $M_x$ layer interconnects 364, 368, 370 extends from the input or the output of the second set of transistor logic of the second subcell 354 entirely over the third subcell 450 to the first subcell 352. Additional $M_x$ layer interconnects may be included within the cell 430 to extend the input/output pin accessibility of the third subcell 450 to the first subcell 352 and/or the second subcell 354. Pin connections may be through intra-cell $M_{x+1}$ layer interconnects.

The MOS logic cell 430 has a first edge at the first subcell 352 and a second edge at the second subcell 354. The first subcell 352 and the third subcell 450 are located adjacent to each other in the first direction. The third subcell 450 and the second subcell 354 are located adjacent to each other in the first direction. Each of the $M_x$ layer interconnects 386 extends across the first subcell 352, the second subcell 354, and the third subcell 450 from the first edge to the second edge.

Figure 5:
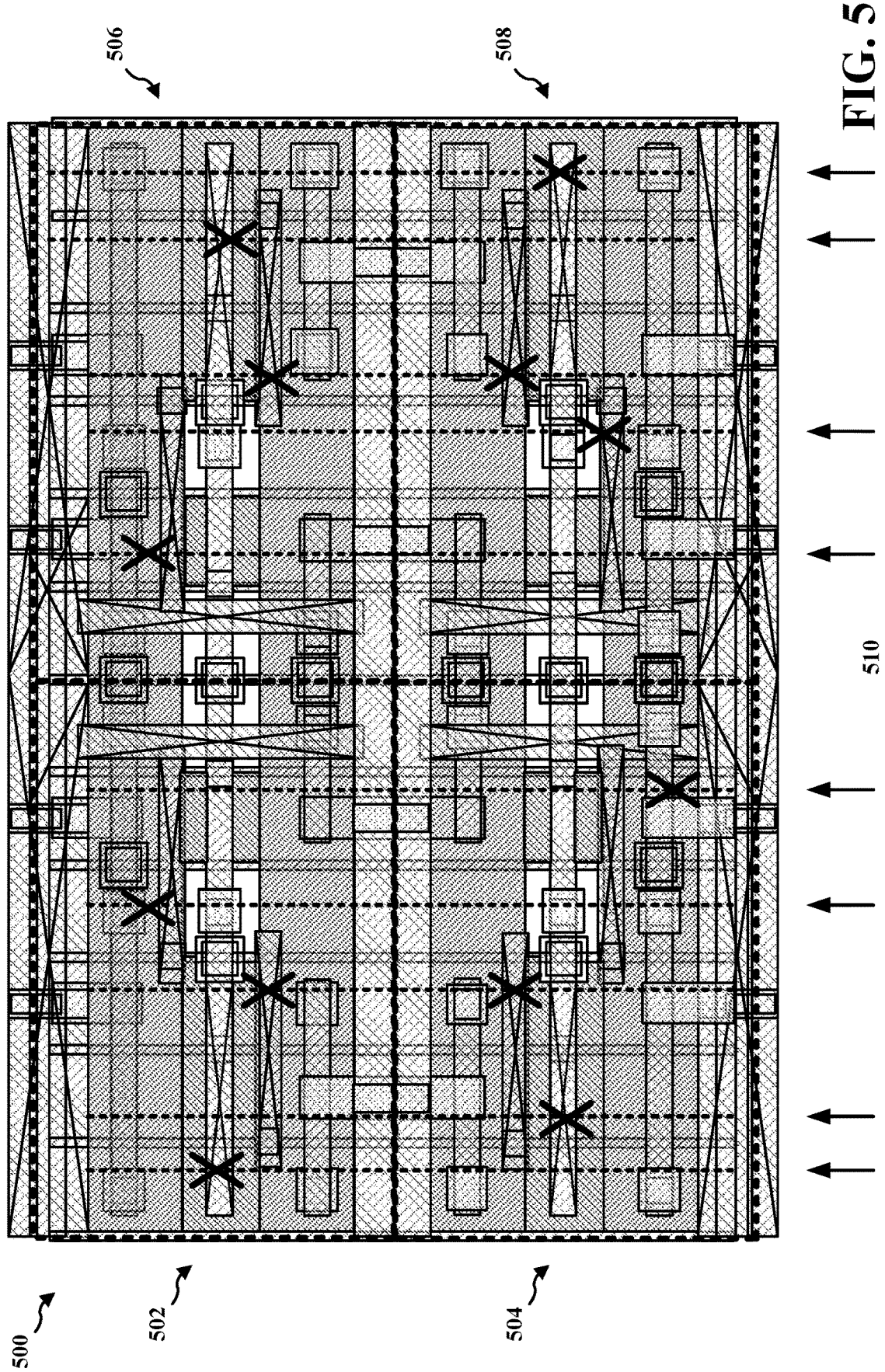
FIG. 5 is a diagram illustrating four individual cells located adjacent to each other.
Figure 6:
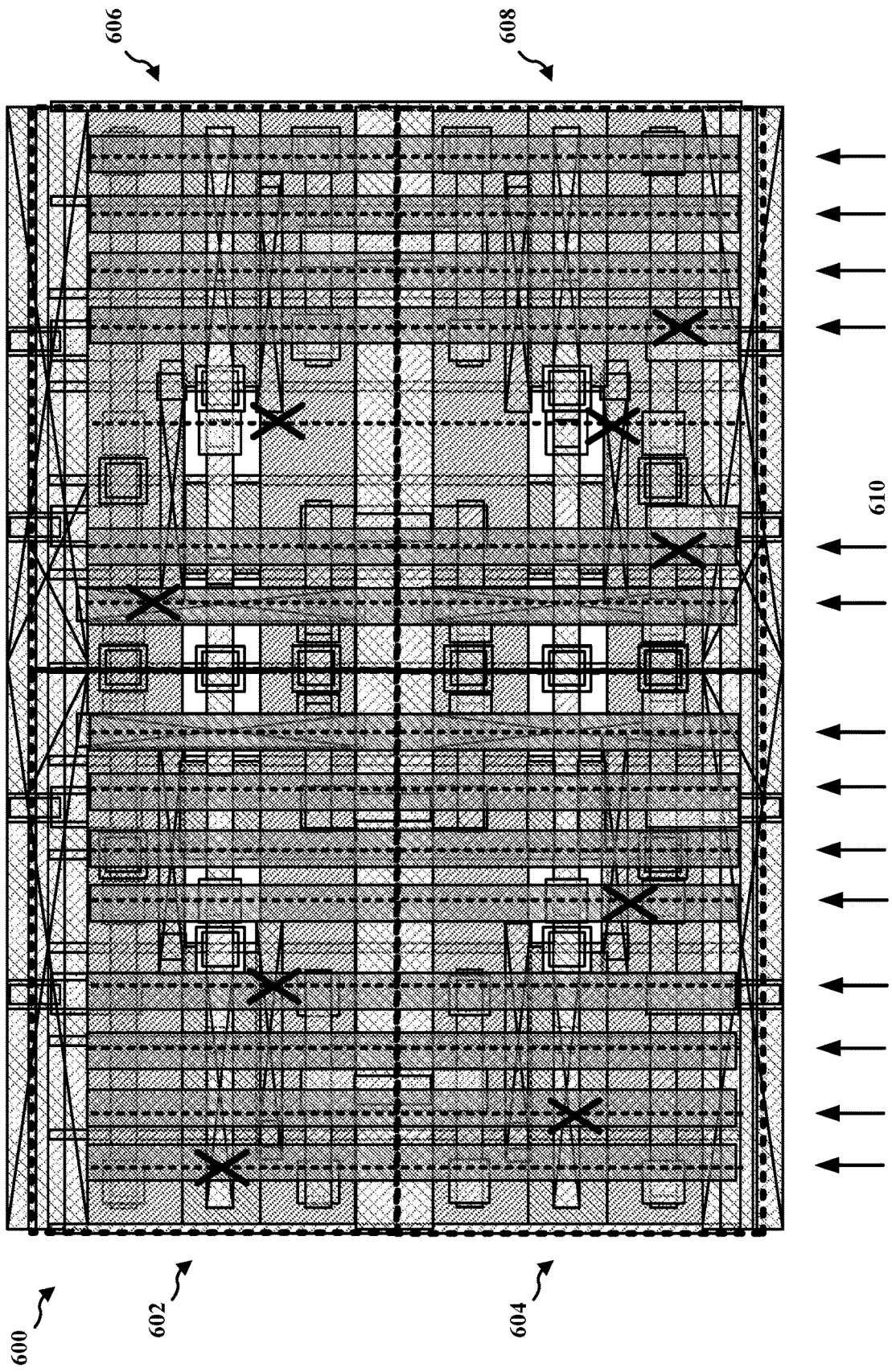
FIG. 6 is a diagram illustrating a multibit multi-height cell.

FIG. 5 is a diagram 500 illustrating four individual cells 502, 504, 506, 508 located adjacent to each other. Through intra-cell routing, intra-cell M2 layer interconnects (at arrows 510) extending across the cells 502, 504 and the cells 506, 508 may be located for 8 of the 16 pins to extend the possible pin locations of those 8 pins. FIG. 6 is a diagram 600 illustrating a multibit multi-height cell including subcells 602, 604, 606, 608. The cells 502, 504, 506, 508 correspond to the subcells 602, 604, 606, 608, respectively. The four individual cells 502, 504, 506, 508 are combined into one multibit multi-height cell with the corresponding subcells 602, 604, 606, 608. The multibit multi-height cell is designed with inter-cell M2 layer interconnects (at arrows 610) extending across the subcells 602, 604 and the subcells 606, 608. The inter-cell M2 layer interconnects extend the possible pin locations for 14 of the 16 pins. As can be seen in the comparison of the multibit multi-height cell of FIG. 6 to the four individual cells of FIG. 5, the multibit multi-height cell improves the pin accessibility, as a greater number of inputs/outputs have greater flexibility with their pin locations. That is, specifically, when a cell is designed to be a multibit multi-height cell, as illustrated in FIG. 6, the cell may be designed with inter-cell M2 layer interconnects (610) that allow for a greater number of inputs/outputs to have improved pin accessibility as compared to utilizing intra-cell M2 layer interconnects (510) with separate cells, as illustrated in FIG. 5.

Figure 7:
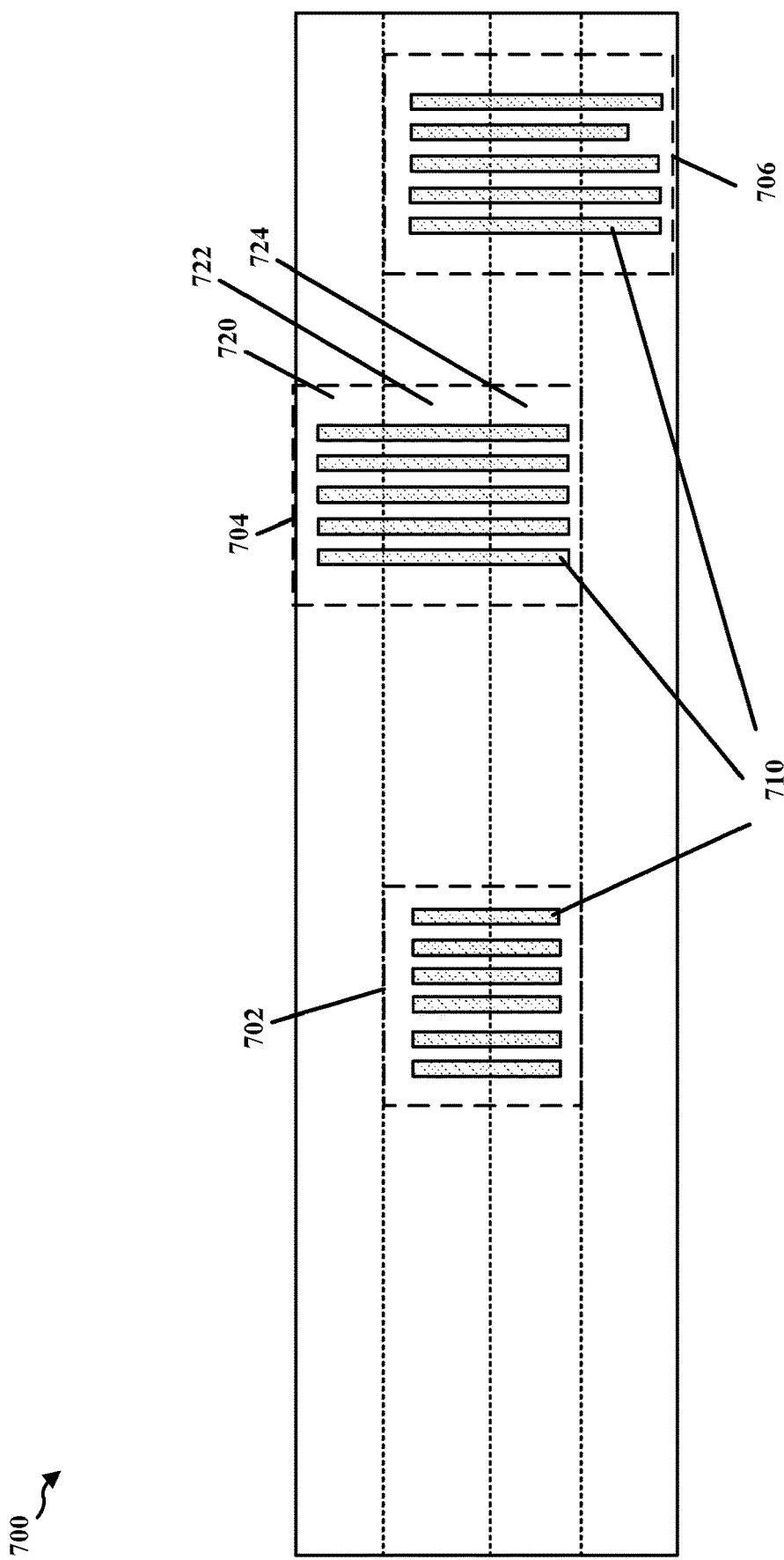
FIG. 7 is a diagram conceptually illustrating a plurality of multibit multi-height cells on an IC.

FIG. 7 is a diagram 700 conceptually illustrating a plurality of multibit multi-height cells on an IC. As illustrated in FIG. 7, the multibit multi-height cells 702, 704, 706, are multi-row cells, where each row includes at least one separate subcell, and each subcell is functionally isolated from other subcells. The multibit multi-height cell 702 is a 2×C cell, where C (columns)≥1 and the number of subcells equals 2*C. The multibit multi-height cells 704, 706 are 3×C cells, where C (columns)≥1 and the number of subcells equals 3*C. For example, if the multibit multi-height cell 704 is a 3×1 cell, multibit multi-height cell 704 would include subcells 720, 722, 724. The inter-cell M2 layer interconnects 710 may extend fully across the height of the multibit multi-height cell, as illustrated by the multibit multi-height cells 702, 704, or a subset of the inter-cell M2 layer interconnects 710 may extend only partially across the height of the multibit multi-height cell, as illustrated by the multibit multi-height cell 706.

Referring again to FIGS. 3, 4, 6, 7, a MOS IC 398 includes a MOS logic cell 330. The MOS logic cell 330 includes a first set of transistor logic in a first subcell 352 of the logic cell 330 and a second set of transistor logic in a second subcell 354 of the logic cell 330. The first set of transistor logic and the second set of transistor logic are functionally isolated from each other within the MOS logic cell 330. The MOS logic cell 330 further includes a first set of $M_x$ layer interconnects 386 on an $M_x$ layer extending in a first direction over the first subcell 352 and the second subcell 354. A first subset of the first set of $M_x$ layer interconnects 362, 366, 370 is coupled to an input or an output of the first set of transistor logic in the first subcell 352 and is unconnected to the second set of transistor logic. Each of the first subset of the first set of $M_x$ layer interconnects 362, 366, 370 extends from the input or the output of the first set of transistor logic of the first subcell 352 to the second subcell 354. Each of the first subset of the first set of $M_x$ layer interconnects 362, 366, 370 is an input/output of the first set of transistor logic.

In one configuration, the MOS logic cell 330 has a first edge (top edge) at the first subcell 352 and a second edge (bottom edge) at the second subcell 354. The first subcell 352 and the second subcell 354 are located adjacent to each other in the first direction. Each $M_x$ layer interconnect of the first set of $M_x$ layer interconnects 386 extends across the first subcell and the second subcell from the first edge to the second edge. In one configuration, the first set of transistor logic and the second set of transistor logic includes a plurality of gate interconnects extending in the first direction (see FIGS. 1, 2), where the gate interconnects form the transistor gates for the first and second sets of transistor logic. In one configuration, the $M_x$ layer is the lowest metal layer or the second lowest metal layer extending unidirectionally in the first direction. In one configuration, the $M_x$ layer is an M2 layer.

In one configuration, the MOS IC 398 further includes a set of $M_{x+1}$ layer interconnects 331, 332, 333 extending in the second direction. Each $M_{x+1}$ layer interconnect of the set of $M_{x+1}$ layer interconnects 331, 332, 333 is coupled to one $M_x$ layer interconnect of the first subset of the first set of $M_x$ layer interconnects 362, 366, 370. For example, the $M_{x+1}$ layer interconnect 331 is coupled to the $M_x$ layer interconnect 366, the $M_{x+1}$ layer interconnect 332 is coupled to the $M_x$ layer interconnect 362, and the $M_{x+1}$ layer interconnect 333 is coupled to the $M_x$ layer interconnect 370. At least one $M_{x+1}$ layer interconnect 332 of the set of $M_{x+1}$ layer interconnects 331, 332, 333 is coupled to a corresponding $M_x$ layer interconnect 362 of the first subset of the first set of $M_x$ layer interconnects 362, 366, 370 above the second subcell 354. Note that in this example, while the $M_x$ layer interconnects 362, 366, 370 extend the pin accessibility of the inputs/outputs a1, b1, z1, respectively, from the first subcell 352 to both the first and second subcells 352, 354, only one pin connection for input a1 is through intra-cell routing above the second subcell 354. In the example, the remaining pin connections for b1, z1 are through intra-cell routing above the first subcell 352.

In one configuration, a second subset 364, 368, 372 of the first set of $M_x$ layer interconnects 386 is coupled to an input or an output of the second set of transistor logic in the second subcell 354 and is unconnected to the first set of transistor logic. Each of the second subset of the first set of $M_x$ layer interconnects 364, 368, 372 extends from the input or the output of the second set of transistor logic of the second subcell 354 to the first subcell 352. Each of the second subset of the first set of $M_x$ layer interconnects 364, 368, 372 is an input/output of the second set of transistor logic.

In one configuration, the MOS IC 398 further includes a set of $M_{x+1}$ layer interconnects 334, 337, 335 extending in the second direction. Each $M_{x+1}$ layer interconnect of the set of $M_{x+1}$ layer interconnects 334, 337, 335 is coupled to one $M_x$ layer interconnect of the second subset of the first set of $M_x$ layer interconnects 364, 368, 372. For example, the $M_{x+1}$ layer interconnect 334 is coupled to the $M_x$ layer interconnect 364, the $M_{x+1}$ layer interconnect 337 is coupled to the $M_x$ layer interconnect 368, and the $M_{x+1}$ layer interconnect 335 is coupled to the $M_x$ layer interconnect 372. At least one $M_{x+1}$ layer interconnect 334 of the set of $M_{x+1}$ layer interconnects 334, 337, 335 is coupled to a corresponding $M_x$ layer interconnect 364 of the second subset of the first set of $M_x$ layer interconnects 364, 368, 372 above the first subcell 352. Note that in this example, while the $M_x$ layer interconnects 364, 368, 372 extend the pin accessibility of the inputs/outputs a2, b2, z2, respectively, from the second subcell 354 to both the first and second subcells 352, 354, only one pin connection for input a2 is through intra-cell routing above the first subcell 352. In the example, the remaining pin connections for b2, z2 are through intra-cell routing above the second subcell 354.

Assuming there is a third subcell 450 between the first subcell 352 and the second subcell 354, referring to FIGS. 4, 7, in one configuration, the MOS logic cell 430, 704 further includes a third set of transistor logic in a third subcell 450, 722 of the logic cell 430, 704. The first (in 352, 720), second (in 354, 724), and third (in 450, 722) sets of transistor logic are functionally isolated from each other within the MOS logic cell 430, 704. The third subcell 450, 722 is between the first subcell 352, 720 and the second subcell 354, 724. The first subset of the first set of $M_x$ layer interconnects 362, 366, 370 is unconnected to the third set of transistor logic. Each of the first subset of the first set of $M_x$ layer interconnects 362, 366, 370 extends from the input or the output of the first set of transistor logic of the first subcell 352, 720 entirely over the third subcell 450, 722 to the second subcell 354, 724. The MOS logic cell 430, 704 has a first edge at the first subcell 352, 720 and a second edge at the second subcell 354, 724. The first subcell 352, 720 and the third subcell 450, 722 are located adjacent to each other in the first direction. The third subcell 450, 722 and the second subcell 354, 724 are located adjacent to each other in the first direction. Each $M_x$ layer interconnect of the first set of $M_x$ layer interconnects 386 extends across the first subcell 352, 720, the second subcell 354, 724, and the third subcell 450, 722 from the first edge to the second edge.

Referring again to FIG. 3, the MOS logic cell 330 further includes a third set of transistor logic in a third subcell 356 of the logic cell 330 and a fourth set of transistor logic in a fourth subcell 358 of the logic cell 330. The first, second, third, and fourth sets of transistor logic are functionally isolated from each other within the MOS logic cell 330. The MOS logic cell 330 further includes a second set of $M_x$ layer interconnects 388 on an $M_x$ layer extending in the first direction over the third subcell 356 and the fourth subcell 358. A first subset of the second set of $M_x$ layer interconnects 374, 378, 382 are coupled to an input or an output of the third set of transistor logic in the third subcell 356 and are unconnected to the fourth set of transistor logic. Each of the first subset of the second set of $M_x$ layer interconnects 374, 378, 382 extends from the input or the output of the third set of transistor logic of the third subcell 356 to the fourth subcell 358. Each of the first subset of the second set of $M_x$ layer interconnects 374, 378, 382 is an input/output of the third set of transistor logic.

In one configuration, the MOS logic cell 330 has a first edge at the third subcell 356 and a second edge at the fourth subcell 358. The third subcell 356 and the fourth subcell 358 are located adjacent to each other in the first direction. Each $M_x$ layer interconnect of the second set of $M_x$ layer interconnects 388 extends across the third subcell 356 and the fourth subcell 358 from the first edge to the second edge.

In one configuration, the MOS IC 398 further includes a set of $M_{x+1}$ layer interconnects 336, 338, 340 extending in the second direction. Each $M_{x+1}$ layer interconnect of the set of $M_{x+1}$ layer interconnects 336, 338, 340 is coupled to one $M_x$ layer interconnect of the first subset of the second set of $M_x$ layer interconnects 374, 378, 382. For example, the $M_{x+1}$ layer interconnect 336 is coupled to the $M_x$ layer interconnect 374, the $M_{x+1}$ layer interconnect 338 is coupled to the $M_x$ layer interconnect 378, and the $M_{x+1}$ layer interconnect 340 is coupled to the $M_x$ layer interconnect 382. At least one $M_{x+1}$ layer interconnect 336, 338, 340 of the set of $M_{x+1}$ layer interconnects 336, 338, 340 is coupled to a corresponding $M_x$ layer interconnect 374, 378, 382, respectively, of the first subset of the second set of $M_x$ layer interconnects 374, 378, 382 above the fourth subcell 358. Note that in this example, the $M_x$ layer interconnects 374, 378, 382 extend the pin accessibility of the inputs/outputs a3, b3, z3, respectively, from the third subcell 356 to both the third and fourth subcells 356, 358. In this example, each pin connection for inputs/outputs a3, b3, z3 is through intra-cell routing above the fourth subcell 358.

In one configuration, a second subset of the second set of $M_x$ layer interconnects 376, 380, 384 is coupled to an input or an output of the fourth set of transistor logic in the fourth subcell 358 and is unconnected to the third set of transistor logic. Each of the second subset of the second set of $M_x$ layer interconnects 376, 380, 384 extends from the input or the output of the fourth set of transistor logic of the fourth subcell 358 to the third subcell 356. Each of the second subset of the second set of $M_x$ layer interconnects 376, 380, 384 is an input/output of the fourth set of transistor logic.

In one configuration, the MOS IC 398 further includes a set of $M_{x+1}$ layer interconnects 342, 344, 346 extending in the second direction. Each $M_{x+1}$ layer interconnect of the set of $M_{x+1}$ layer interconnects 342, 344, 346 is coupled to one $M_x$ layer interconnect of the second subset of the second set of $M_x$ layer interconnects 376, 380, 384. For example, the $M_{x+1}$ layer interconnect 342 is coupled to the $M_x$ layer interconnect 376, the $M_{x+1}$ layer interconnect 344 is coupled to the $M_x$ layer interconnect 380, and the $M_{x+1}$ layer interconnect 346 is coupled to the $M_x$ layer interconnect 384. At least one $M_{x+1}$ layer interconnect 342, 344, 346 of the set of $M_{x+1}$ layer interconnects 342, 344, 346 is coupled to a corresponding $M_x$ layer interconnect 376, 380, 384, respectively, of the second subset of the second set of $M_x$ layer interconnects 376, 380, 384 above the third subcell 356. Note that in this example, the $M_x$ layer interconnects 376, 380, 384 extend the pin accessibility of the inputs/outputs a4, b4, z4, respectively, from the fourth subcell 358 to both the third and fourth subcells 356, 358. In this example, each pin connection for inputs/outputs a4, b4, z4 is through intra-cell routing above the third subcell 356.

In one configuration, the third subcell 356 is adjacent one of the first subcell 352 or the second subcell 354 in a second direction orthogonal to the first direction, and the fourth subcell 358 is adjacent an other one of the first subcell 352 or the second subcell 354 in the second direction. As illustrated in FIG. 3, the third subcell 356 is adjacent the first subcell 352 in the second direction, and the fourth subcell 358 is adjacent the second subcell 354 in the second direction.

In one configuration, the first set of transistor logic and the second set of transistor logic are at least one of AOI logic or OAI logic. In one configuration, the first set of transistor logic and the second set of transistor logic each have at least three inputs/outputs.

As discussed supra, pin routing for cells can be congested when cell pins are located close together, such as in high pin density cells. A cell architecture is provided with respect to FIGS. 3, 4, 6, 7 that improves pin routing accessibility. A MOS IC including a MOS logic cell is provided, where the MOS logic cell includes a plurality of subcells in which inter-cell $M_x$ layer interconnects within the cell extend across at least two subcells in the first direction. At least a subset of the $M_x$ layer interconnects are connected to the inputs/outputs of the transistor logic in each of the subcells. The $M_x$ layer interconnects extend the pin routing accessibility of pin connections made through intra-cell routing after placement of the cell. As such, at least some pin connections through intra-cell $M_{x+1}$ layer interconnects (extending in the second direction) may be made over a subcell different than the subcell associated with the corresponding inputs/outputs. The provided cell architecture reduces pin congestion and improves pin routing accessibility.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Example 1 is a MOS IC including a MOS logic cell including a first set of transistor logic in a first subcell of the logic cell and a second set of transistor logic in a second subcell of the logic cell. The first set of transistor logic and the second set of transistor logic are functionally isolated from each other within the MOS logic cell. The MOS logic cell further includes a first set of $M_x$ layer interconnects on an $M_x$ layer extending in a first direction over the first subcell and the second subcell. A first subset of the first set of $M_x$ layer interconnects is coupled to an input or an output of the first set of transistor logic in the first subcell and is unconnected to the second set of transistor logic. Each of the first subset of the first set of $M_x$ layer interconnects extends from the input or the output of the first set of transistor logic of the first subcell to the second subcell. Each of the first subset of the first set of $M_x$ layer interconnects is an input/output of the first set of transistor logic.

Example 2 is the MOS IC of example 1, wherein the MOS logic cell has a first edge at the first subcell and a second edge at the second subcell. The first subcell and the second subcell are located adjacent to each other in the first direction. Each $M_x$ layer interconnect of the first set of $M_x$ layer interconnects extends across the first subcell and the second subcell from the first edge to the second edge.

Example 3 is the MOS IC of any of examples 1 and 2, wherein the first set of transistor logic and the second set of transistor logic include a plurality of gate interconnects extending in the first direction.

Example 4 is the MOS IC of any of examples 1 to 3, wherein the $M_x$ layer is a lowest metal layer or a second lowest metal layer extending in the first direction.

Example 5 is the MOS IC of example 4, wherein the $M_x$ layer is an M2 layer.

Example 6 is the MOS IC of any of examples 1 to 5, wherein the MOS IC further includes a set of $M_{x+1}$ layer interconnects extending in the second direction. Each $M_{x+1}$ layer interconnect of the set of $M_{x+1}$ layer interconnects is coupled to one $M_x$ layer interconnect of the first subset of the first set of $M_x$ layer interconnects. At least one $M_{x+1}$ layer interconnect of the set of $M_{x+1}$ layer interconnects is coupled to a corresponding $M_x$ layer interconnect of the first subset of the first set of $M_x$ layer interconnects above the second subcell.

Example 7 is the MOS IC of any of examples 1 to 6, wherein a second subset of the first set of $M_x$ layer interconnects is coupled to an input or an output of the second set of transistor logic in the second subcell and is unconnected to the first set of transistor logic. Each of the second subset of the first set of $M_x$ layer interconnects extends from the input or the output of the second set of transistor logic of the second subcell to the first subcell. Each of the second subset of the first set of $M_x$ layer interconnects is an input/output of the second set of transistor logic.

Example 8 is the MOS IC of example 7, wherein the MOS IC further includes a set of $M_{x+1}$ layer interconnects extending in the second direction. Each $M_{x+1}$ layer interconnect of the set of $M_{x+1}$ layer interconnects is coupled to one $M_x$ layer interconnect of the second subset of the first set of $M_x$ layer interconnects. At least one $M_{x+1}$ layer interconnect of the set of $M_{x+1}$ layer interconnects is coupled to a corresponding $M_x$ layer interconnect of the second subset of the first set of $M_x$ layer interconnects above the first subcell.

Example 9 is the MOS IC of any of examples 1 to 8, wherein the MOS logic cell further includes a third set of transistor logic in a third subcell of the logic cell. The first, second, and third sets of transistor logic are functionally isolated from each other within the MOS logic cell. The third subcell is between the first subcell and the second subcell. The first subset of the first set of $M_x$ layer interconnects is unconnected to the third set of transistor logic. Each of the first subset of the first set of $M_x$ layer interconnects extends from the input or the output of the first set of transistor logic of the first subcell entirely over the third subcell to the second subcell.

Example 10 is the MOS IC of example 9, wherein the MOS logic cell has a first edge at the first subcell and a second edge at the second subcell. The first subcell and the third subcell are located adjacent to each other in the first direction. The third subcell and the second subcell are located adjacent to each other in the first direction. Each $M_x$ layer interconnect of the first set of $M_x$ layer interconnects extends across the first subcell, the second subcell, and the third subcell from the first edge to the second edge.

Example 11 is the MOS IC of any of examples 1 to 10, wherein the MOS logic cell further includes a third set of transistor logic in a third subcell of the logic cell and a fourth set of transistor logic in a fourth subcell of the logic cell. The first, second, third, and fourth sets of transistor logic are functionally isolated from each other within the MOS logic cell. The MOS logic cell further includes a second set of $M_x$ layer interconnects on an $M_x$ layer extending in the first direction over the third subcell and the fourth subcell. A first subset of the second set of $M_x$ layer interconnects is coupled to an input or an output of the third set of transistor logic in the third subcell and is unconnected to the fourth set of transistor logic. Each of the first subset of the second set of $M_x$ layer interconnects extends from the input or the output of the third set of transistor logic of the third subcell to the fourth subcell. Each of the first subset of the second set of $M_x$ layer interconnects is an input/output of the third set of transistor logic.

Example 12 is the MOS IC of example 11, wherein the MOS logic cell has a first edge at the third subcell and a second edge at the fourth subcell. The third subcell and the fourth subcell are located adjacent to each other in the first direction. Each $M_x$ layer interconnect of the second set of $M_x$ layer interconnects extends across the third subcell and the fourth subcell from the first edge to the second edge.

Example 13 is the MOS IC of example 12, wherein the MOS IC further includes a set of $M_{x+1}$ layer interconnects extending in the second direction. Each $M_{x+1}$ layer interconnect of the set of $M_{x+1}$ layer interconnects is coupled to one $M_x$ layer interconnect of the first subset of the second set of $M_x$ layer interconnects. At least one $M_{x+1}$ layer interconnect of the set of $M_{x+1}$ layer interconnects is coupled to a corresponding $M_x$ layer interconnect of the first subset of the second set of $M_x$ layer interconnects above the fourth subcell.

Example 14 is the MOS IC of any of examples 11 to 13, wherein a second subset of the second set of $M_x$ layer interconnects is coupled to an input or an output of the fourth set of transistor logic in the fourth subcell and is unconnected to the third set of transistor logic. Each of the second subset of the second set of $M_x$ layer interconnects extends from the input or the output of the fourth set of transistor logic of the fourth subcell to the third subcell. Each of the second subset of the second set of $M_x$ layer interconnects is an input/output of the fourth set of transistor logic.

Example 15 is the MOS IC of example 14, wherein the MOS IC further includes a set of $M_{x+1}$ layer interconnects extending in the second direction. Each $M_{x+1}$ layer interconnect of the set of $M_{x+1}$ layer interconnects is coupled to one $M_x$ layer interconnect of the second subset of the second set of $M_x$ layer interconnects. At least one $M_{x+1}$ layer interconnect of the set of $M_{x+1}$ layer interconnects is coupled to a corresponding $M_x$ layer interconnect of the second subset of the second set of $M_x$ layer interconnects above the third subcell.

Example 16 is the MOS IC of any of examples 11 to 15, wherein the third subcell is adjacent one of the first subcell or the second subcell in a second direction orthogonal to the first direction, and the fourth subcell is adjacent an other one of the first subcell or the second subcell in the second direction.

Example 17 is the MOS IC of any of examples 1 to 16, wherein the first set of transistor logic and the second set of transistor logic are at least one of AOI logic or OAI logic.

Example 18 is the MOS IC of any of examples 1 to 17, wherein the first set of transistor logic and the second set of transistor logic each have at least three inputs/outputs.

What is claimed is:

1. A metal oxide semiconductor (MOS) integrate circuit (IC), comprising:
a MOS logic cell comprising:
a first set of transistor logic in a first subcell of the logic cell and a second set of transistor logic in a second subcell of the logic cell, the first set of transistor logic and the second set of transistor logic being functionally isolated from each other within the MOS logic cell; and
a first set of metal x ($M_x$) layer interconnects on an $M_x$ layer extending in a first direction over the first subcell and the second subcell, a first subset of the first set of $M_x$ layer interconnects being coupled to an input or an output of the first set of transistor logic in the first subcell and being unconnected to the second set of transistor logic, each of the first subset of the first set of $M_x$ layer interconnects extending from the input or the output of the first set of transistor logic of the first subcell to the second subcell, each of the first subset of the first set of $M_x$ layer interconnects being an input/output of the first set of transistor logic.

2. The MOS IC of claim 1, wherein the MOS logic cell has a first edge at the first subcell and a second edge at the second subcell, the first subcell and the second subcell are located adjacent to each other in the first direction, and each $M_x$ layer interconnect of the first set of $M_x$ layer interconnects extends across the first subcell and the second subcell from the first edge to the second edge.

3. The MOS IC of claim 1, wherein the first set of transistor logic and the second set of transistor logic comprises a plurality of gate interconnects extending in the first direction.

4. The MOS IC of claim 1, wherein the $M_x$ layer is a lowest metal layer or a second lowest metal layer extending in the first direction.

5. The MOS IC of claim 4, wherein the $M_x$ layer is a metal 2 (M2) layer.

6. The MOS IC of claim 1, wherein the MOS IC further comprises a set of $M_{x+1}$ layer interconnects extending in the second direction, each $M_{x+1}$ layer interconnect of the set of $M_{x+1}$ layer interconnects being coupled to one $M_x$ layer interconnect of the first subset of the first set of $M_x$ layer interconnects, at least one $M_{x+1}$ layer interconnect of the set of $M_{x+1}$ layer interconnects being coupled to a corresponding $M_x$ layer interconnect of the first subset of the first set of $M_x$ layer interconnects above the second subcell.

7. The MOS IC of claim 1, wherein a second subset of the first set of $M_x$ layer interconnects is coupled to an input or an output of the second set of transistor logic in the second subcell and is unconnected to the first set of transistor logic, each of the second subset of the first set of $M_x$ layer interconnects extending from the input or the output of the second set of transistor logic of the second subcell to the first subcell, each of the second subset of the first set of $M_x$ layer interconnects being an input/output of the second set of transistor logic.

8. The MOS IC of claim 7, wherein the MOS IC further comprises a set of $M_{x+1}$ layer interconnects extending in the second direction, each $M_{x+1}$ layer interconnect of the set of $M_{x+1}$ layer interconnects being coupled to one $M_x$ layer interconnect of the second subset of the first set of $M_x$ layer interconnects, at least one $M_{x+1}$ layer interconnect of the set of $M_{x+1}$ layer interconnects being coupled to a corresponding $M_x$ layer interconnect of the second subset of the first set of $M_x$ layer interconnects above the first subcell.

9. The MOS IC of claim 1, wherein the MOS logic cell further comprises a third set of transistor logic in a third subcell of the logic cell, the first, second, and third sets of transistor logic being functionally isolated from each other within the MOS logic cell, the third subcell being between the first subcell and the second subcell, the first subset of the first set of $M_x$ layer interconnects being unconnected to the third set of transistor logic, each of the first subset of the first set of $M_x$ layer interconnects extending from the input or the output of the first set of transistor logic of the first subcell entirely over the third subcell to the second subcell.

10. The MOS IC of claim 9, wherein the MOS logic cell has a first edge at the first subcell and a second edge at the second subcell, the first subcell and the third subcell are located adjacent to each other in the first direction, the third subcell and the second subcell are located adjacent to each other in the first direction, and each $M_x$ layer interconnect of the first set of $M_x$ layer interconnects extends across the first subcell, the second subcell, and the third subcell from the first edge to the second edge.

11. The MOS IC of claim 1, wherein the MOS logic cell further comprises:
a third set of transistor logic in a third subcell of the logic cell and a fourth set of transistor logic in a fourth subcell of the logic cell, the first, second, third, and fourth sets of transistor logic being functionally isolated from each other within the MOS logic cell; and
a second set of $M_x$ layer interconnects on an $M_x$ layer extending in the first direction over the third subcell and the fourth subcell, a first subset of the second set of $M_x$ layer interconnects being coupled to an input or an output of the third set of transistor logic in the third subcell and being unconnected to the fourth set of transistor logic, each of the first subset of the second set of $M_x$ layer interconnects extending from the input or the output of the third set of transistor logic of the third subcell to the fourth subcell, each of the first subset of the second set of $M_x$ layer interconnects being an input/output of the third set of transistor logic.

12. The MOS IC of claim 11, wherein the MOS logic cell has a first edge at the third subcell and a second edge at the fourth subcell, the third subcell and the fourth subcell are located adjacent to each other in the first direction, and each $M_x$ layer interconnect of the second set of $M_x$ layer interconnects extends across the third subcell and the fourth subcell from the first edge to the second edge.

13. The MOS IC of claim 12, wherein the MOS IC further comprises a set of $M_{x+1}$ layer interconnects extending in the second direction, each $M_{x+1}$ layer interconnect of the set of $M_{x+1}$ layer interconnects being coupled to one $M_x$ layer interconnect of the first subset of the second set of $M_x$ layer interconnects, at least one $M_{x+1}$ layer interconnect of the set of $M_{x+1}$ layer interconnects being coupled to a corresponding $M_x$ layer interconnect of the first subset of the second set of $M_x$ layer interconnects above the fourth subcell.

14. The MOS IC of claim 11, wherein a second subset of the second set of $M_x$ layer interconnects is coupled to an input or an output of the fourth set of transistor logic in the fourth subcell and is unconnected to the third set of transistor logic, each of the second subset of the second set of $M_x$ layer interconnects extending from the input or the output of the fourth set of transistor logic of the fourth subcell to the third subcell, each of the second subset of the second set of $M_x$ layer interconnects being an input/output of the fourth set of transistor logic.

15. The MOS IC of claim 14, wherein the MOS IC further comprises a set of $M_{x+1}$ layer interconnects extending in the second direction, each $M_{x+1}$ layer interconnect of the set of $M_{x+1}$ layer interconnects being coupled to one $M_x$ layer interconnect of the second subset of the second set of $M_x$ layer interconnects, at least one $M_{x+1}$ layer interconnect of the set of $M_{x+1}$ layer interconnects being coupled to a corresponding $M_x$ layer interconnect of the second subset of the second set of $M_x$ layer interconnects above the third subcell.

16. The MOS IC of claim 11, wherein the third subcell is adjacent one of the first subcell or the second subcell in a second direction orthogonal to the first direction, and the fourth subcell is adjacent an other one of the first subcell or the second subcell in the second direction.

17. The MOS IC of claim 1, wherein the first set of transistor logic and the second set of transistor logic are at least one of AND-OR-Invert (AOI) logic or OR-AND-Invert (OAI) logic.

18. The MOS IC of claim 1, wherein the first set of transistor logic and the second set of transistor logic each have at least three inputs/outputs.

\* \* \* \* \*